United States Patent
Jelonnek et al.

(10) Patent No.: US 7,170,346 B2
(45) Date of Patent: Jan. 30, 2007

(54) ARRANGEMENT FOR REDUCING NON-LINEAR DISTORTIONS IN AN OUTPUT SIGNAL OF AN AMPLIFIER STAGE

(75) Inventors: Björn Jelonnek, Ulm (DE); Armin Splett, Ulm (DE)

(73) Assignee: Siemens Aktiengesellschaft, Munich (DE)

(*) Notice: Subject to any disclaimer, the term of this patent is extended or adjusted under 35 U.S.C. 154(b) by 27 days.

(21) Appl. No.: 10/507,849

(22) PCT Filed: Feb. 27, 2003

(86) PCT No.: PCT/DE03/00643

§ 371 (c)(1),
(2), (4) Date: Sep. 15, 2004

(87) PCT Pub. No.: WO03/079540

PCT Pub. Date: Sep. 25, 2003

(65) Prior Publication Data

US 2005/0127996 A1    Jun. 16, 2005

(30) Foreign Application Priority Data

Mar. 15, 2002 (DE) ............... 102 11 537
Mar. 15, 2002 (EP) ................ 02006023

(51) Int. Cl.
*H03F 1/00* (2006.01)
*H03F 1/26* (2006.01)

(52) U.S. Cl. ................ 330/151; 330/149

(58) Field of Classification Search ............ None
See application file for complete search history.

(56) References Cited

U.S. PATENT DOCUMENTS 5,986,500 A   11/1999  Park et al. ............ 330/124 D
6,259,320 B1 * 7/2001  Valk et al. .............. 330/151

FOREIGN PATENT DOCUMENTS

EP    0768752 A1    4/1997

OTHER PUBLICATIONS

Broomfield et al., "Broadband Negative Group Delay Networks for Compensation of Microwave Oscillators and Filters", Electronics Letters, Nov. 9, 2000, vol. 36, No. 23, pp. 1931-1933.
Lucyszyn et al., "Negative Group Delay Synthesiser", Electronics Letters, Apr. 29, 1993, vol. 29, No. 9, pp. 798-800.

* cited by examiner

*Primary Examiner*—Khanh Van Nguyen
(74) *Attorney, Agent, or Firm*—Staas & Halsey LLP

(57) ABSTRACT

A system reduces non-linear distortions in an output signal of an amplifier stage that is configured according to the feed forward principle. An amplifier stage input signal arrives at a main branch of an amplifier. The output signal of the amplifier, which is distorted in a non-linear manner, arrives at an adder. An output of the adder forms the amplifier stage output signal. The output signal which is distorted in a non-linear manner and the amplifier stage input signal are fed to a secondary branch that comprises an error signal device. The error signal device generates an error signal from the delayed amplifier stage input signal and the output signal of the amplifier, which is distorted in a non-linear manner. The error signal is fed to the adder in order to reduce distortions in the amplifier stage output signal. The error signal device comprises at least one transmission device that is provided with a negative group delay time.

10 Claims, 5 Drawing Sheets

US 7,170,346 B2

ARRANGEMENT FOR REDUCING NON-LINEAR DISTORTIONS IN AN OUTPUT SIGNAL OF AN AMPLIFIER STAGE

CROSS REFERENCE TO RELATED APPLICATIONS

This application is based on and hereby claims priority to PCT Application No. PCT/DE03/00643 filed on Feb. 27, 2003, German Application No. 102 11 537.0 filed on Mar. 15, 2002 and European Application No. 02006023.2 filed on Mar. 15, 2002, the contents of which are hereby incorporated by reference.

BACKGROUND OF THE INVENTION

The invention relates to a system for reducing non-linear distortions for an amplifier stage output signal of an amplifier stage.

To compensate for non-liner distortions amplifier stages are embodied in accordance with what is known as the "feed-forward-principle". Here in a main branch of the amplifier stage an amplifier stage input signal is routed via a non-ideal amplifier of which the non-linearly distorted output signal is routed with a delay to an adder and on the other side is routed to an auxiliary branch.

The amplifier stage input signal is also routed to the auxiliary branch where an error signal is obtained from the non-runtime-delayed amplifier stage input signal and from the non-linearly distorted output signal of the amplifier which is routed to the adder for distortion compensation. From the error signal and the non-linearly distorted output signal of the amplifier the added forms the amplifier stage output signal, in which case the error signal compensates for the non-linear distortions of the amplifier.

With the "feed-forward principle" the non-linearly distorted output signal of the amplifier must be correspondingly delayed in accordance with a group delay time needed to determine the error signal in the auxiliary branch. A delay of this type is generally realized using a delay line with finite electrical quality. The delay line exhibits electrical losses which in their turn make the efficiency of the amplifier stage worse.

To reduce the losses a correspondingly complex and expensive implementation of the delay line is necessary in which further attenuations are caused by the delay line.

SUMMARY OF THE INVENTION

One possible object of the present invention relates to improving the efficiency of an amplifier stage embodied according to the "feed-forward principle".

The inventors propose an amplifier that significantly reduces the manufacturing effort involved.

Because of the main branch proposed by the inventors, depending on the application, the amplifier stage may be simple to implement in microstrip technology, the volume required for the "feed-forward" amplifier stage is reduced.

The efficiency of the amplifier stage is improved since losses are reduced within the main branch.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
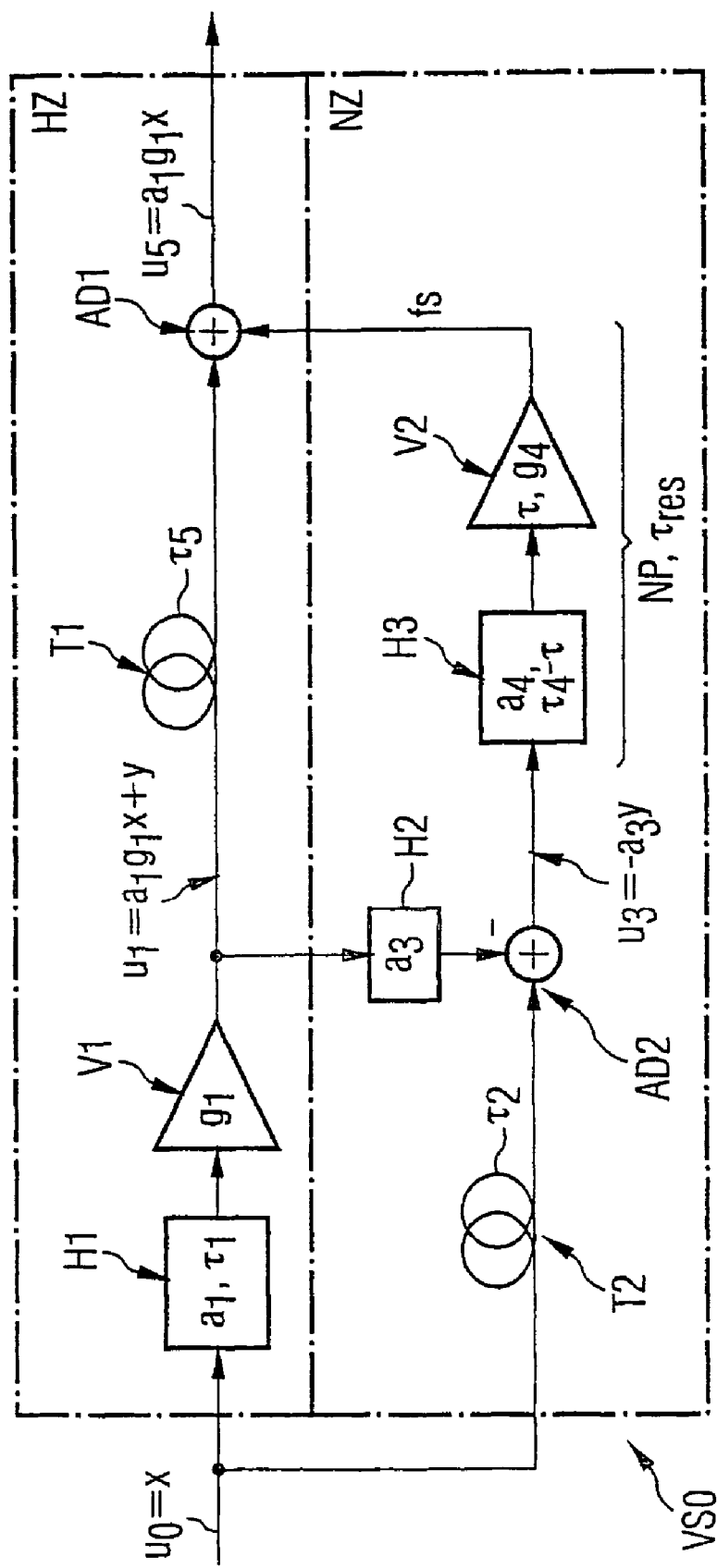
FIG. 1 is a basic circuit diagram of an amplifier stage embodied in accordance with the feed forward principle, as per the related art.

Reference will now be made in detail to the preferred embodiments of the present invention, examples of which are illustrated in the accompanying drawings, wherein like reference numerals refer to like elements throughout.

FIG. 1 shows a basic circuit diagram of an amplifier stage VS0 embodied in accordance with the feed forward principle in accordance with the related art.

An amplifier stage input signal u0 arrives the amplifier stage VS0 which is connected to both a main branch HZ and also to the auxiliary branch NZ of amplifier stage VS0 as an input signal. An amplifier stage output signal u5 is generated by amplifier stage VS0 in which non-linear distortions are reduced with the aid of an error signal fs formed by auxiliary branch NZ.

The main branch HZ contains connected in series a first transmission device H1, which features an attenuation a1 and a group delay time $\tau 1$, a non-ideal first amplifier V1 with an amplification g1, a delay element T1 with a group delay time $\tau 5$ and a first adder AD1.

The auxiliary branch NZ contains a series circuit comprising a delay T2 with a group delay time $\tau 2$, a second adder AD2 as well as a third transmission device H3 with an attenuation a4 and with a group delay time $\tau 4$-$\tau$. The third transmission device H3 has a second amplifier V2 with an amplification g4 and with a group delay time $\tau$ connected downstream from it. The auxiliary branch furthermore contains in a transverse branch a second transmission device H2, which is connected on one side at the output of the first amplifier V1 in the main branch HZ and on the other side to a second adder AD2.

The third transmission device H3 and the second amplifier V2 will be grouped into what is known as an error signal device NP for which the output signal reaches the first adder AD1 as an error signal. The error signal unit NP thus features a resulting group delay time $\tau res$ composed of the group delay times of the third transmission device H3 and of the second amplifier V2.

In the main branch HZ the amplifier stage input signal u0 arrives via the first transmission device H1 at the first amplifier V1 assumed to be not ideal of which the non-linear distorted output signal u1 features an error component y. This means that: $u1 = a1 \cdot g1 \cdot x + y$ with $x = u0$.

Group delay times caused by the first amplifier V1 are taken into account by the group delay time $\tau 1$ of the first transmission device H1.

The non-linear distorted output signal u1 of the first amplifier V1 on one side arrives via the delay element T1 at the first adder AD1 and on the other side via the second transmission device H2 negated at a second input of the second adder AD2, in which case at a first input of the second adder the amplifier stage input signal u0 delayed by the delay element T2 is connected.

This means that for an output signal u3 of the second adder AD2 which arrives at the error signal device NP as an input signal: u3=−a3*y, with τ2=π1 and with a1*g1=1/a3.

The input signal u3 of the error signal device NP arrives via the third transmission device H3 at the second amplifier V2, for which the output signal is error signal fs.

In this case the following applies: τ5=τ4 and a3*a4*g4=1, which means that fs=y.

The non-linear distorted output signal u1 of the first amplifier V1 is connected to a first input of the first adder AD1. The first adder AD1 forms the amplifier stage output voltage u5 from this. In this case the following applies with the requirements given above: u5=a1*gl*x.

The branches and adders shown here are generally implemented as directional couplers. Phase reversals of the voltages are not taken into account individually here.

Since the second amplifier V2 merely amplifies the error component Y it can be driven linearly so that only negligible non-linear distortions are created through it.

Delay element T2 is for example embodied as a delay line and for frequency f exhibits an attenuation A, where the following applies: A=10 dB*$\log_{10}$ (e)2πft$_S$/Q=27.3 dB*ft$_S$/Q.

As a further embodiment of the delay element T2 a filter is possible which also features the same attenuation A at the same quality Q.

Figure 2:
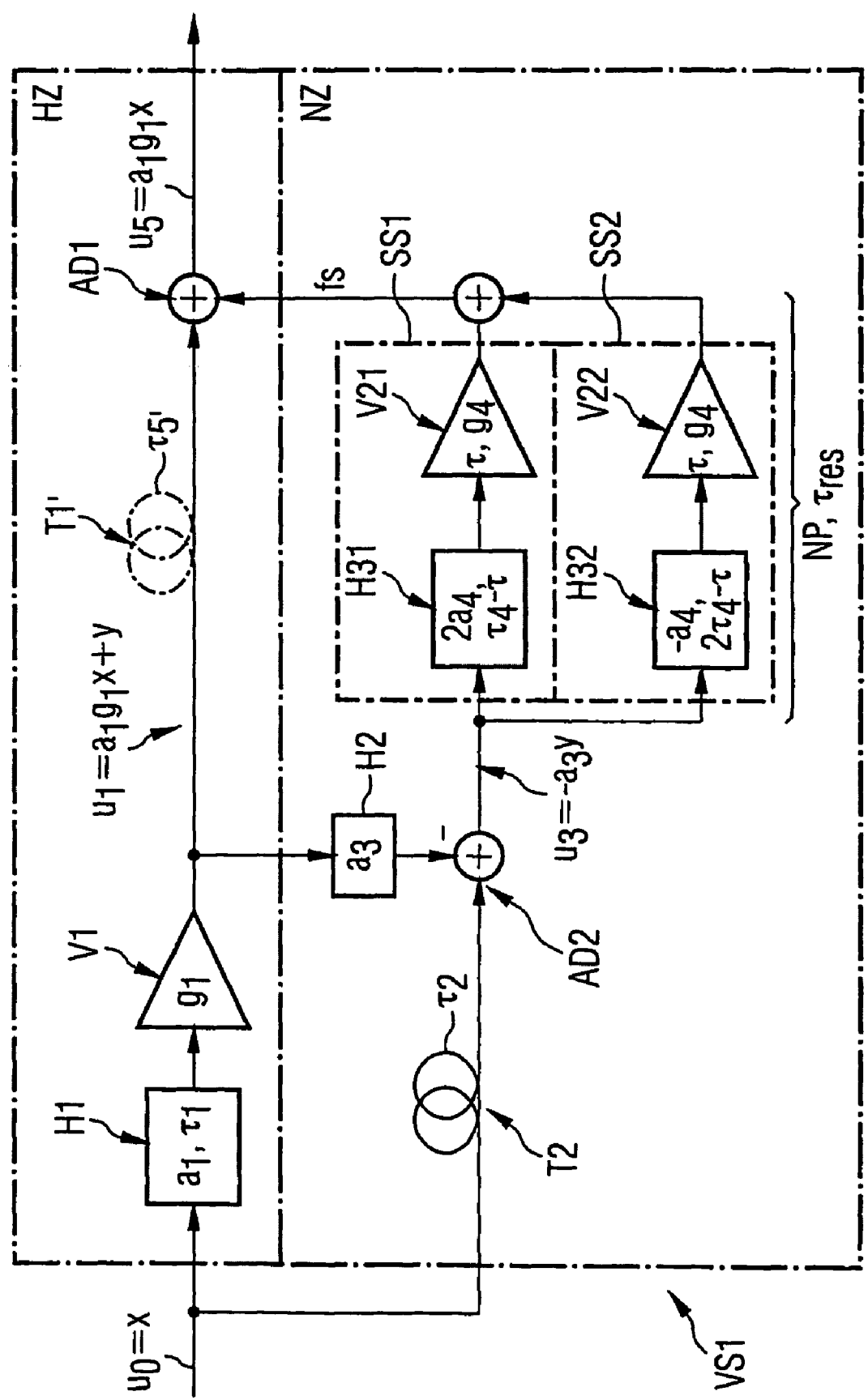
FIG. 2 is, by comparison with FIG. 1, a basic circuit diagram of an amplifier stage in accordance with one embodiment of the invention.

FIG. 2 by comparison with FIG. 1 shows a basic circuit diagram of an amplifier stage VS1.

By comparison with FIG. 1 the starting point here is an ideal case in which in the main branch a delay element T1' with a group delay time τ5' is embodied such that the non-linear distorted output signal u1 of the first amplifier V1 essentially arrives with no delay at the first adder AD1 in which case this ideal condition must be taken into consideration accordingly with the aid of the resulting group delay time τres of the error signal device NP.

The error signal device NP here includes two series circuits SS1 and SS2, where each of these series circuits features a third transmission device H31 or H32 and the relevant transmission device features downstream amplifiers V21 or V22.

In a further embodiment provision is made for arranging more than two series circuits in parallel with one another.

In this case it is also possible to connect a common amplifier downstream of the third transmission device.

However in this case it is always the case that the resulting group delay time τres of the error signal device NP is formed such that a group delay time τ5' occurring between the first amplifier V1 and the first adder AD1 is taken into account accordingly.

For the case described here "essentially delay-free" the resulting group delay time τres of the error signal device NP is to be selected as negative in the desired frequency range.

The error signal device NP here features a digital filter, in which case the two transmission devices H31 or. H32 feature 2*a4 and τ4-τ or. −a4 and 2 τ4-τ as coefficients.

The output signals of the two amplifiers V21 and V22 are added with the aid of a further adder to error signal fs which again reaches the first adder AD1.

Under the condition a3*a4*g4=1 the following applies for the amplifier stage signal u5:

$$u_5=a_1g_1x+y/1-2\exp(-j2\pi f\tau_4)+\exp(-j2\pi f2\tau_4)]$$

Through a correspondingly small group delay time τ$_4$-τ the group delay time τ4 can be set so that a product f$_0$τ$_4$ is a whole number, in which case f$_0$ here is a mid frequency of a working range of the amplifier V21 or V22. For a storage frequency δf=f-f$_0$ the following then applies:

$$u_5=a_1g_1x+y/1-2\exp(-j2\pi\delta f\tau_4)+\exp(-j2\pi\delta f2\tau 4)]$$

With a series development:

$$[1-2\exp(-j2\pi\delta f\tau_4)+\exp(-j2\pi\delta f2\tau 4)]$$

$$-(-j2\pi\delta f\tau_4)^2+2(j2\pi\delta f\tau_4)^2-\tfrac{1}{3}(j2\pi\delta f\tau_4)^3+\tfrac{4}{3}(j2\pi\delta f\tau_4)^3$$

$$+\ldots$$

$$=(j2\pi\delta f\tau_4)^2+(j2\pi\delta f\tau_4)^3+\ldots$$

a suppression of non-linear distortions is produced for error component Y for small storage frequencies δfτ4<<1 in output signal u$_5$ by around −20 dB*$\log_{10}$ (2πδfτ$_4$).

Unlike the ideal case, in reality with amplifier stage VS1 in the main branch HZ between the output of the amplifier V1 and the adder AD1 the delay element T1' with a lower group delay time τ5' compared to the related art will be arranged. For this case the negative group delay times will be selected for the third transmission devices in such a way that the resulting group delay time τres of the error signal device NP compensates for the group delay time τ5', i.e. τres=τ5'.

Figure 3:
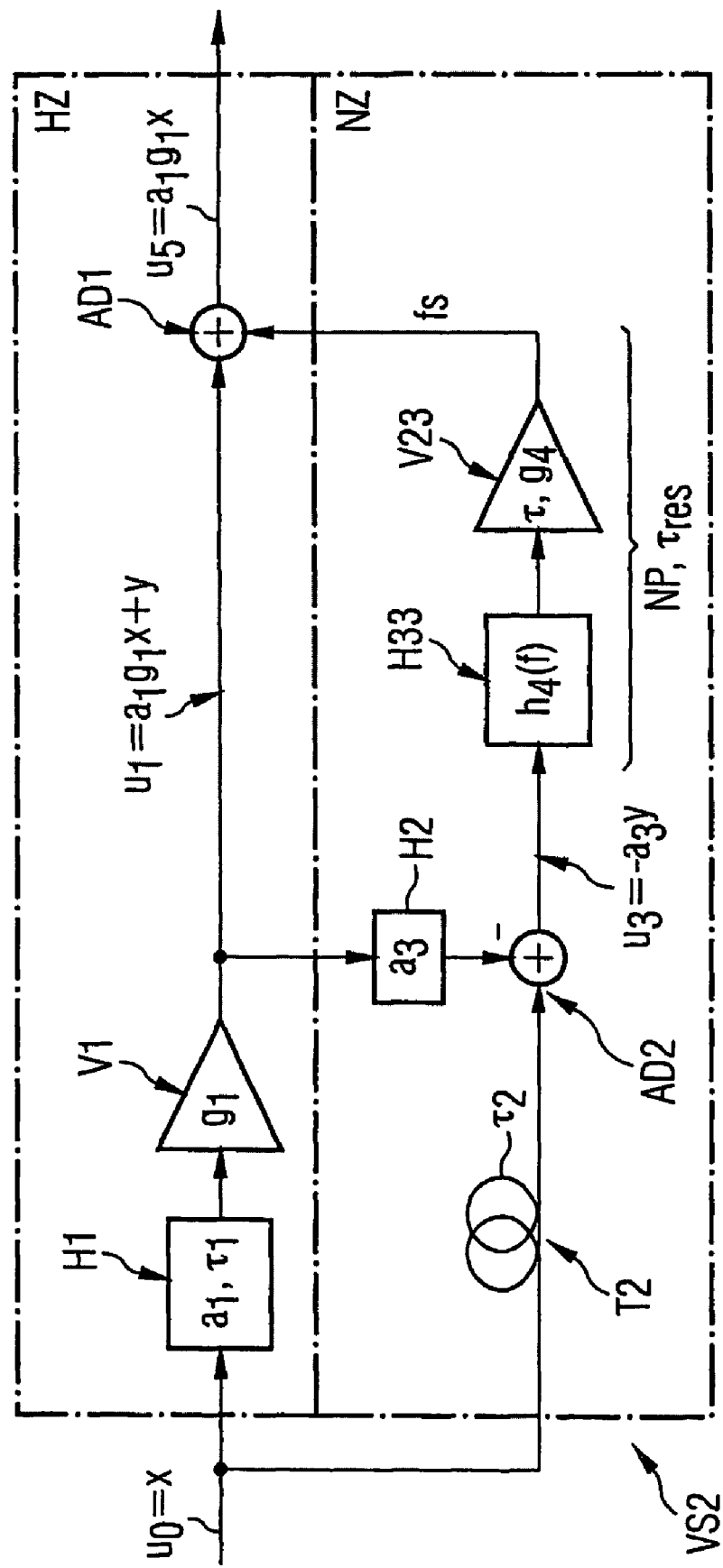
FIG. 3 is a basic circuit diagram of a further amplifier stage according to one embodiment of the invention.

FIG. 3 shows a basic circuit diagram of an amplifier stage VS2.

Compared with FIG. 2 an error signal device NP contains only a series circuit with a third transmission device H33 and a second amplifier V23.

The third transmission device H33 will be formed for example by a passive filter with a negative group delay time. The output signal of the second amplifier again arrives as the error signal fs at the first adder AD1.

A transmission function $[1-\exp(-j2\pi\delta f\tau_4)]^n-1$ of the error signal device NP will for large and whole number powers "n" only be reached in a good approximation with one amplifier V23, in which case the upstream filter approximates at least for small storage frequencies δfτ4<<1 to a filter transmission function $h4(f)=\{[1--\exp(-j2\pi\delta f\tau_4)]^n-1\}*\exp(+j2\pi f\tau)/g_4$. This is possible in principle for τ4>τ.

Since the third transmission device H33 embodied as a filter only transmits low high-frequency powers the insertion loss of the filter is ignored.

Figure 4:
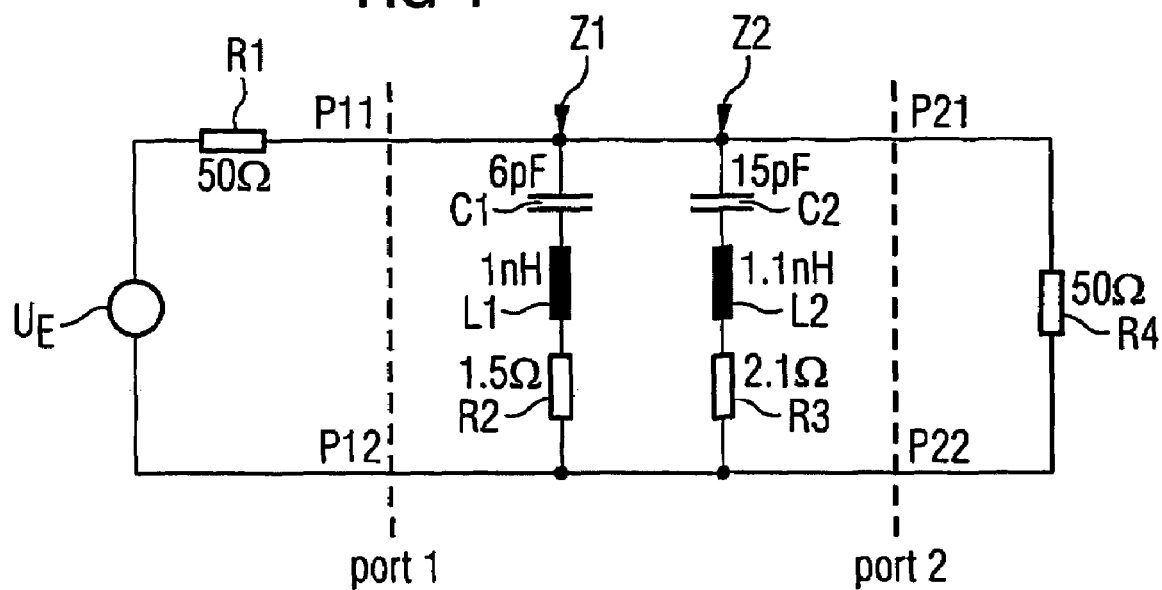
FIG. 4 is an exemplary embodiment for a transmission device envisaged in the system shown in FIG. 3, and FIG. 5 to FIG. 7 are transmission graphs of the analog filter shown in FIG. 4.

FIG. 4 shows an exemplary embodiment for the third transmission device H33 for which there is provision in the system according to FIG. 3 which is embodied as an analog filter with negative group delay time.

A voltage source uE with a resistor R1=50 is connected at two reference points P11 and P12 of a first access port. between the reference points P11 and P12 a first and a second branch, Z1 and Z2, are connected in parallel to each other, where the first branch Z1 features a series circuit with a capacitor C1=6 pF, an inductor L1=1 nH and a resistor R2=1,5.

The second branch Z2 features a series circuit with a capacitor C2=15 pF, an inductor L1=1,1 nH and a resistor R3=1,5. An output voltage can be tapped at a second access port, port 2 via two reference points P21 and P22 at a resistor R4=50.

Figure 5:
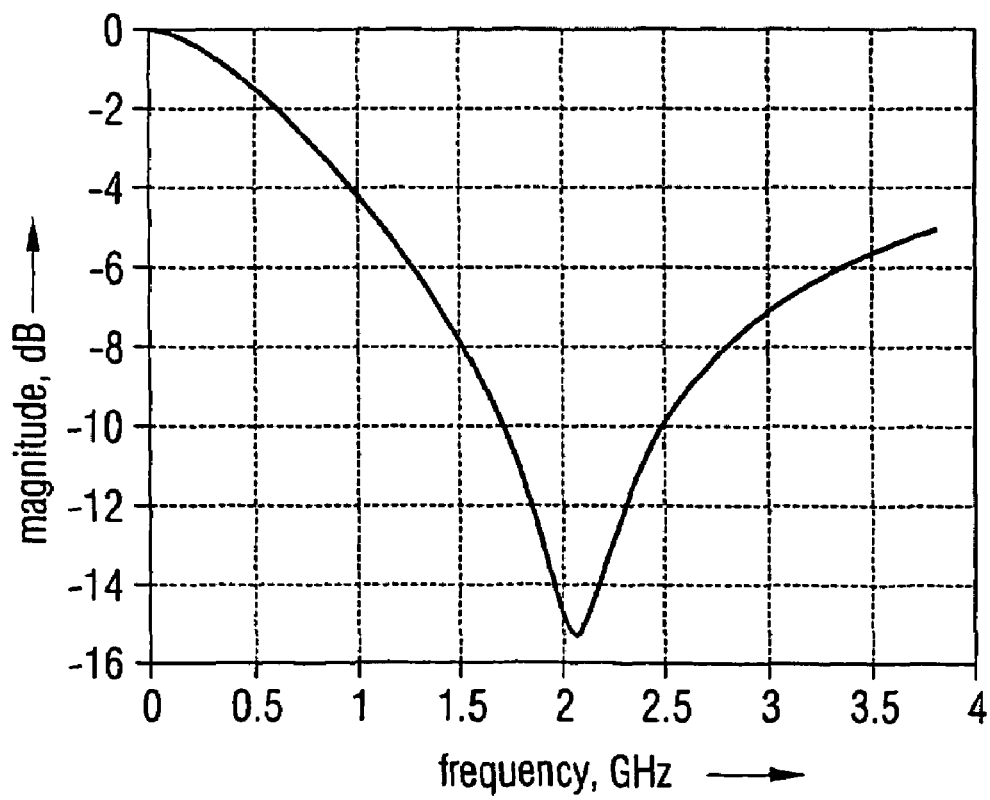
Figure 6:
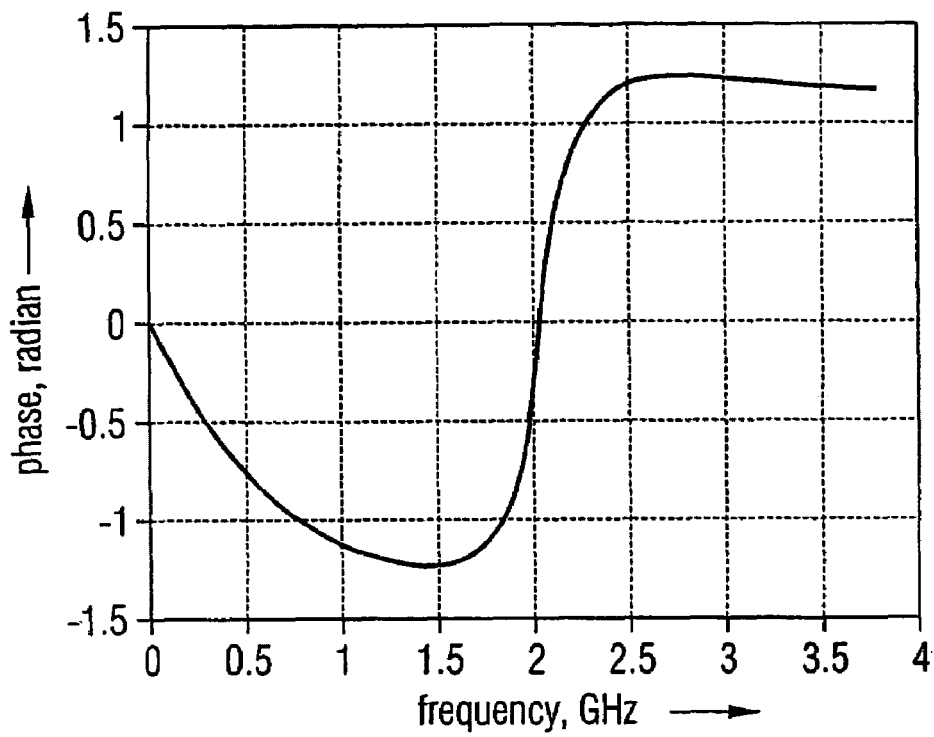
Figure 7:
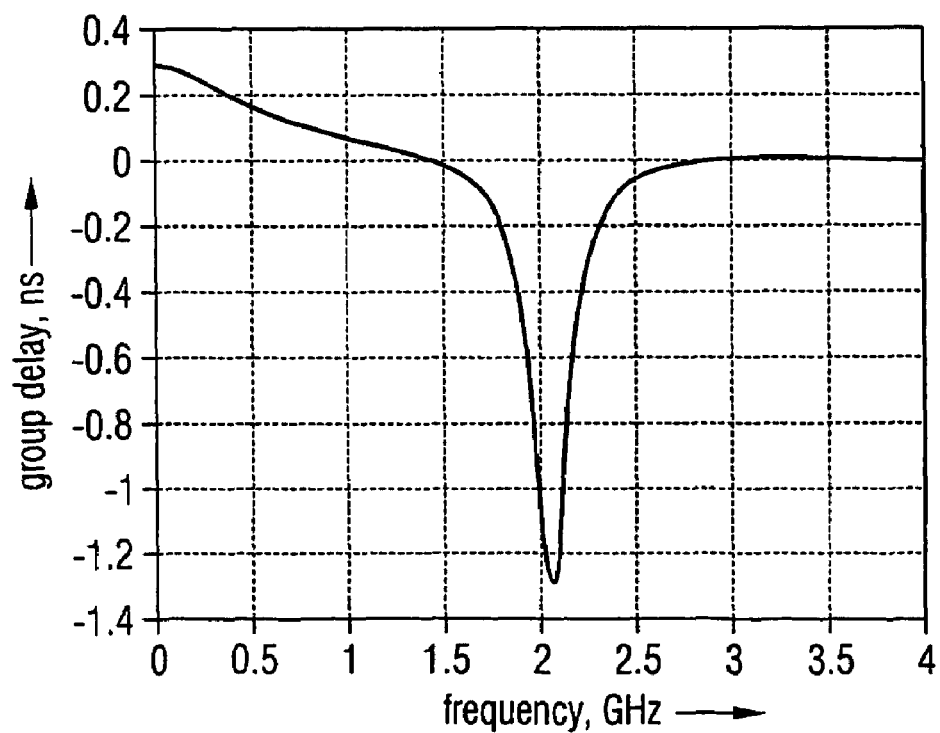

FIG. 5 to FIG. 7 show transmission graphs of the analog filter shown in FIG. 4.

FIG. 5 shows a frequency-dependent transmission graph, in which frequency in GHZ is plotted on the x axis and amplitude values in "dB" are plotted on the y axis.

FIG. 6 shows a frequency-dependent transmission graph, in which frequencies in GHz are plotted on the x axis and phases in "radians" are plotted on the y axis.

Finally FIG. 7 shows a frequency-dependent graph in which frequencies in GHz are plotted on the x axis and group delay times in seconds are plotted on the y axis.

The invention has been described in detail with particular reference to preferred embodiments thereof and examples, but it will be understood that variations and modifications can be effected within the spirit and scope of the invention covered by the claims which may include the phrase "at least one of A, B and C" or a similar phrase as an alternative expression that means one or more of A, B and C may be used, contrary to the holding in Superguide v. DIRECTV, 69 USPQ2d 1865 (Fed. Cir. 2004).

The invention claimed is:

1. A system for reducing non-linear distortion in an amplifier output signal, comprising:
   a main branch comprising a first amplifier and a first adder, the first adder having an output and first and second inputs, the first amplifier receiving an amplifier input signal, the first amplifier supplying a non-linear distorted signal to the first input of the first adder, the output of the first adder forming the amplifier output signal;
   an auxiliary branch comprising:
      a second adder having an output and positive and negative inputs, the positive input of the second adder receiving a time delayed version of the amplifier input signal, the negative input of the second adder receiving the non-linear distorted signal of the first amplifier;
      an error signal device receiving a signal from the output of the second adder, the error signal device forming an error signal, which is supplied to the second input of the first adder, the error signal device comprising:
         at least one transmission device with a negative group delay time; and
         at least one amplifier with a positive group delay time, the error signal device having a collective group delay time dimensioned such that non-linear distortions are minimized for the amplifier output signal by adding the error signal and the non-linear distorted signal
      wherein the main branch is formed without a delay element such that the non-linear distorted signal of the main branch arrives at the first input of the first adder with essentially no delay.

2. The system in accordance with claim 1, further comprising a first transmission device, the first amplifier being connected at an input of the first transmission device such that the amplifier input signal is received at the first amplifier via the first transmission device.

3. The system in accordance with claim 1, wherein the at least one transmission device provided in the error signal device comprises a first transmission device, and
   the system further comprises:
      a first delay element connected to the positive input of the second adder to delay the amplifier input signal; and
      a second transmission device outside of the error signal device, connected to the negative input of the second adder to negate and attenuate the non-linear distorted signal of the first amplifier.

4. The system in accordance with claim 1, wherein the error signal device has at least one series circuit, a first series circuit being formed of the at least one transmission device and the at least one amplifier arranged in series.

5. The system according to claim 4, wherein the at least one transmission device of the first series circuit is an analog filter with the negative group delay time, in a desired frequency range.

6. The system in accordance with claim 2, further comprising:
   a first delay element connected to the positive input of the second adder to delay the amplifier input signal; and
   a second transmission device connected to the negative input of the second adder to negate and attenuate the non-linear distorted signal of the first amplifier.

7. A system for reducing non-linear distortion in an amplifier output signal, comprising:
   a main branch comprising a first amplifier and a first adder, the first adder having an output and first and second inputs, the first amplifier receiving an amplifier input signal, the first amplifier supplying a non-linear distorted signal to the first input of the first adder, the output of the first adder forming the amplifier output signal;
   an auxiliary branch comprising:
      a second adder having an output and positive and negative inputs, the positive input of the second adder receiving a time delayed version of the amplifier input signal, the negative input of the second adder receiving the non-linear distorted signal of the first amplifier;
      an error signal device receiving a signal from the output of the second adder, the error signal device forming an error signal, which is supplied to the second input of the first adder, the error signal device comprising:
         at least one transmission device with a negative group delay time; and
         at least one amplifier with a positive group delay time, the error signal device having a collective group delay time dimensioned such that non-linear distortions are minimized for the amplifier output signal by adding the error signal and the non-linear distorted signal, wherein
   the error signal device comprises at least two series circuits each with at least one transmission device and at least one amplifier,
   a first of the series circuits has the transmission device and the amplifier arranged in series,
   the transmission device of the first series circuit forms a digital filter with the negative group delay time, and
   the negative group delay time is in a desired frequency range.

8. A system for reducing non-linear distortion in an amplifier output signal, comprising:
   a main branch comprising a first amplifier and a first adder, the first adder having an output and first and second inputs, the first amplifier receiving an amplifier input signal, the first amplifier supplying a non-linear distorted signal to the first input of the first adder, the output of the first adder forming the amplifier output signal;
   an auxiliary branch comprising:
      a second adder having an output and positive and negative inputs, the positive input of the second adder receiving a time delayed version of the amplifier input signal, the negative input of the second adder receiving the non-linear distorted signal of the first amplifier;

an error signal device receiving a signal from the output of the second adder, the error signal device forming an error signal, which is supplied to the second input of the first adder, the error signal device comprising:
  at least one transmission device with a negative group delay time; and
  at least one amplifier with a positive group delay time, the error signal device having a collective group delay time dimensioned such that non-linear distortions are minimized for the amplifier output signal by adding the error signal and the non-linear distorted signal, a first transmission device, the first amplifier being connected at an input of the first transmission device such that the amplifier input signal is received at the first amplifier via the first transmission device;

a first delay element connected to the positive input of the second adder to delay the amplifier input signal; and a second transmission device connected to the negative input of the second adder to negate and attenuate the non-linear distorted signal of the first amplifier wherein the error signal device has a third transmission device and a second amplifier arranged in series.

9. The system according to claim 8, wherein the third transmission device is an analog filter with the negative group delay time, in a desired frequency range.

10. The system according to claim 8, wherein the error signal device comprises at least two series circuits, one of the series circuits is formed from a third transmission device and a second amplifier arranged in series, the third transmission device forms a digital filter with the negative group delay time, and the negative group delay time is in a desired frequency range.

* * * * *